United States Patent
Inuma et al.

(10) Patent No.: US 11,994,535 B2
(45) Date of Patent: May 28, 2024

(54) PROBE UNIT

(71) Applicant: NHK Spring Co., Ltd., Yokohama (JP)

(72) Inventors: Tsuyoshi Inuma, Kanagawa (JP); Shuji Takahashi, Kanagawa (JP)

(73) Assignee: NHK Spring Co., Ltd., Yokohama (JP)

( * ) Notice: Subject to any disclaimer, the term of this patent is extended or adjusted under 35 U.S.C. 154(b) by 89 days.

(21) Appl. No.: 17/294,844

(22) PCT Filed: Nov. 26, 2019

(86) PCT No.: PCT/JP2019/046234
§ 371 (c)(1),
(2) Date: May 18, 2021

(87) PCT Pub. No.: WO2020/111075
PCT Pub. Date: Jun. 4, 2020

(65) Prior Publication Data
US 2022/0018877 A1    Jan. 20, 2022

(30) Foreign Application Priority Data
Nov. 27, 2018    (JP) .................................. 2018-221493

(51) Int. Cl.
*G01R 1/04*    (2006.01)
*G01R 1/067*    (2006.01)
(Continued)

(52) U.S. Cl.
CPC ..... *G01R 1/07371* (2013.01); *G01R 1/06722* (2013.01); *G01R 1/06772* (2013.01); *G01R 31/2886* (2013.01)

(58) Field of Classification Search
CPC .......... G01R 1/04; G01R 1/067; G01R 1/073; G01R 31/02; G01R 31/26; G01R 31/28
See application file for complete search history.

(56) References Cited

U.S. PATENT DOCUMENTS 6,037,787 A    3/2000 Corwith
6,844,748 B2*    1/2005 Sato .................... G01R 1/07371
324/754.03
(Continued)

FOREIGN PATENT DOCUMENTS

JP    2000-40571 A    2/2000
JP    2002-506211 A    2/2002
(Continued)

OTHER PUBLICATIONS

Japan Decision to Grant a Patent dated Sep. 8, 2020, issued for JP Patent Application No. 2020-538157 and English translation thereof.

*Primary Examiner* — Neel D Shah
(74) *Attorney, Agent, or Firm* — Locke Lord LLP (57) ABSTRACT

A probe unit includes: a first contact probe configured to come in contact with a signal electrode; a second contact probe configured to come in contact with a ground electrode; a probe holder including a first holder hole through which the first contact probe passes, and a second holder hole through which the second contact probe passes; and a conductive floating member including a first through hole to which the first contact probe is inserted and the signal electrode is inserted, and a second through hole to which the second contact probe is inserted and the ground electrode is inserted. The probe holder is configured such that at least an inner circumferential surface of the first holder hole has an insulating property, and the probe unit has a coaxial structure in which central axes of the first contact probe and the first through hole are aligned with each other.

5 Claims, 7 Drawing Sheets (51) Int. Cl.
*G01R 1/073* (2006.01)
*G01R 31/26* (2020.01)
*G01R 31/28* (2006.01)

(56) References Cited

U.S. PATENT DOCUMENTS

| | | | |
|---|---|---|---|
| 7,601,009 B2 * | 10/2009 | Di Stefano | G01R 1/06738 439/73 |
| 7,663,387 B2 | 2/2010 | Yoshida et al. | |
| 7,785,147 B2 * | 8/2010 | Nakayama | G01R 1/07314 439/607.05 |
| 8,535,101 B2 | 9/2013 | Suzuki et al. | |
| 2006/0066330 A1 * | 3/2006 | Yoshida | G01R 1/06772 324/756.03 |
| 2014/0203829 A1 * | 7/2014 | Yamada | G01R 31/26 324/750.01 |
| 2018/0238957 A1 | 8/2018 | Nakamura et al. | |

FOREIGN PATENT DOCUMENTS

| | | |
|---|---|---|
| JP | 2004-170182 A | 6/2004 |
| JP | 2009-85948 A | 4/2009 |
| JP | 2012-098219 A | 5/2012 |
| WO | 99/45400 A1 | 9/1999 |
| WO | 2007/074700 A1 | 7/2007 |
| WO | 2008/050443 A1 | 5/2008 |
| WO | 2013/051099 A1 | 4/2013 |

* cited by examiner

PROBE UNIT

FIELD

The present invention relates to a probe unit that houses a contact probe that inputs and outputs signals to and from a predetermined circuit structure.

BACKGROUND

Conventionally, a conduction state inspection or an operating characteristic inspection of an inspection target such as a semiconductor integrated circuit or a liquid crystal panel is performed by using a probe unit that includes a contact probe that achieves electrical connection between the inspection target and a signal processing device that outputs an inspection signal and that includes a probe holder that houses a plurality of the contact probes.

Generally, input/output of a high frequency electric signal involves an occurrence of signal loss referred to as insertion loss. In order to achieve operation in the probe unit at high speed with high accuracy, it is important to reduce this insertion loss in the frequency domain to be used. For example, Patent Literature 1 discloses a technique of providing an air layer around a contact probe to perform characteristic impedance matching.

CITATION LIST

Patent Literature

Patent Literature 1: JP 2012-98219 A

SUMMARY

Technical Problem

Unfortunately, however, according to the technique disclosed in Patent Literature 1, although the impedance of the central portion of the contact probe can be adjusted, the characteristic impedance of an end, particularly an end on the side in contact with an inspection target cannot be adjusted.

The present invention has been made in view of the above, and aims to provide a probe unit capable of adjusting the characteristic impedance of an end of the contact probe, that is, an end on the side in contact with an inspection target.

Solution to Problem

To solve the above-described problem and achieve the object, a probe unit according to the present invention includes: a first contact probe configured to come in contact with a signal electrode provided on a contact target on one end side in a longitudinal direction; a second contact probe configured to come in contact with a ground electrode provided on the contact target on one end side in a longitudinal direction; a probe holder including a first holder hole through which the first contact probe passes, and a second holder hole through which the second contact probe passes; and a conductive floating member including a first through hole to which the one end of the first contact probe is inserted from one end side and the signal electrode is inserted from another end side, and a second through hole to which the one end of the second contact probe is inserted from one end side and the ground electrode is inserted from another end side, wherein the probe holder is configured such that at least an inner circumferential surface of the first holder hole has an insulating property, and the probe unit has a coaxial structure in which a central axis of the first contact probe and a central axis of the first through hole of the floating member are aligned with each other.

Moreover, in the above-described probe unit according to the present invention, a maximum diameter of the first through hole is larger than a maximum diameter of the second through hole.

Moreover, in the above-described probe unit according to the present invention, a tubular insulating member is provided on an inner circumferential surface of the first through hole, and a diameter of an inner circumferential surface of the insulating member is equal to or less than a diameter of the second through hole.

Moreover, in the above-described probe unit according to the present invention, the first through hole has a stepped shape having a diameter corresponding to the one end of the first contact probe and the signal electrode.

Moreover, in the above-described probe unit according to the present invention, the floating member includes a connection pin configured to position the floating member with respect to the probe holder, and the probe holder includes: an insulating main body including the first holder hole, and a partial holder hole forming a part of the second holder hole; and a conductive member having conductivity, the conductive member including a first hole that constitutes a part of the second holder hole, the second contact probe passing through the first hole, and a second hole configured to house a part of the connection pin.

Advantageous Effects of Invention

According to the present invention, it is possible to adjust the characteristic impedance of an end of the contact probe, that is, an end on the side in contact with an inspection target.

DESCRIPTION OF EMBODIMENTS

Hereinafter, embodiments for carrying out the present invention will be described in detail with reference to the drawings. The present invention is not limited to the following embodiments. Individual figures referred to in the following description merely schematically illustrate the shapes, dimensions, and positional relationships to the extent that the content of the present invention can be understood. Therefore, the present invention is not to be limited to the shapes, dimensions, and positional relationships illustrated in the individual figures.

First Embodiment

Figure 1:
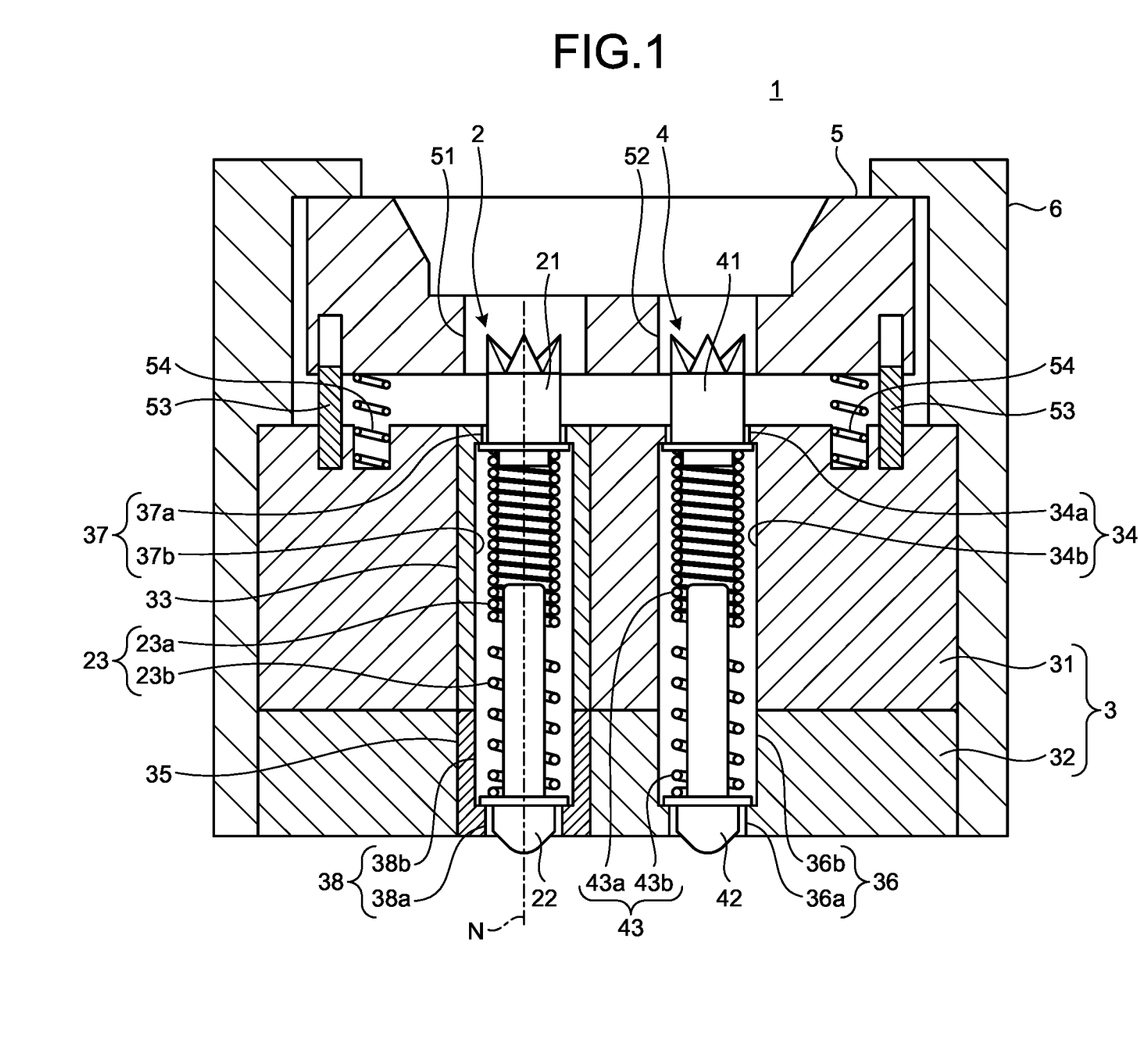
FIG. 1 is a partial cross-sectional view illustrating a configuration of a main part of a probe unit according to a first embodiment of the present invention.

FIG. 1 is a partial cross-sectional view illustrating a configuration of a main part of a probe unit according to a first embodiment of the present invention. A probe unit 1 illustrated in FIG. 1 is a device used in electrical characteristic inspection of a semiconductor integrated circuit (a semiconductor integrated circuit 100 described below), which is an inspection target, and is a device that provides electrical connection between the semiconductor integrated circuit and a circuit substrate (a circuit substrate 200 described below) that outputs an inspection signal to the semiconductor integrated circuit.

The probe unit 1 includes: a contact probe 2 for signals, which is conductive and comes in contact with the electrodes of a semiconductor integrated circuit 100 and a circuit substrate 200, which are two mutually different contact objects, at both ends in the longitudinal direction, for achieving conduction of an inspection signal (hereinafter, simply referred to as "signal probe 2"); a probe holder 3 that houses and holds the signal probe 2 and a ground contact probe 4 described below according to a predetermined pattern; the ground contact probe 4 (hereinafter, referred to as a "ground probe 4") that is connected to external ground electrodes; a floating member 5 that regulates misalignment between the probe holder 3 and the semiconductor integrated circuit, or the like; and a base member 6 that is provided around the probe holder 3 and the floating member 5 and that fixes and holds the probe holder 3.

The signal probe 2 is formed with a conductive material and includes: a first plunger 21 that comes in contact with an electrode to which an inspection signal of the semiconductor integrated circuit 100 is input when the semiconductor integrated circuit 100 is inspected; a second plunger 22 that comes in contact with an electrode that outputs an inspection signal of the circuit substrate 200 equipped with an inspection circuit; and a spring member 23 provided between the first plunger 21 and the second plunger 22 to link the first plunger 21 and the second plunger 22 in an extendable/contractible manner. The first plunger 21, the second plunger 22, and the spring member 23 constituting the signal probe 2 share an identical axis. When the semiconductor integrated circuit 100 is brought into contact with the signal probe 2, extension and contraction of the spring member 23 in the axial direction softens the impact on a connecting electrode of the semiconductor integrated circuit 100 as well as applying a load to the semiconductor integrated circuit 100 and the circuit substrate 200. In the following, regarding the signal probe 2, the side coming in contact with the electrode of the semiconductor integrated circuit 100 is referred to as a distal end side, while the side opposite to the semiconductor integrated circuit 100 side in the axial direction is referred to as a proximal end side. Furthermore, when the distal end side and the proximal end side are defined by the plunger alone, the directions in the plunger in contact with the semiconductor integrated circuit 100 are defined such that the semiconductor integrated circuit 100 side is the distal end side and the side opposite to the semiconductor integrated circuit 100 side in the axial direction is the proximal end side. Furthermore, in the plunger that comes into contact with the circuit substrate 200, the circuit substrate 200 side is referred to as the distal end side and the side opposite to the circuit substrate 200 side in the axial direction is referred to as the proximal end side.

Being movable in the axial direction by the expansion and contraction action of the spring member 23, the first plunger 21 is energized in the direction of the semiconductor integrated circuit 100 by the elastic force of the spring member 23 and comes into contact with the electrode of the semiconductor integrated circuit 100. Furthermore, the second plunger 22 can move in the axial direction by the extension and contraction action of the spring member 23, and is energized in the circuit substrate 200 direction by the elastic force of the spring member 23 and comes into contact with the electrode of the circuit substrate 200.

The spring member 23 has a solid coiling portion 23a on the first plunger 21 side, and a coarse coiling portion 23b on the second plunger 22 side. The end of the solid coiling portion 23a is linked to the first plunger 21. The end of the coarse coiling portion 23b is linked to the second plunger 22. Furthermore, the first plunger 21 and the second plunger 22 are engaged by coil winding force, and/or joined by soldering, with the spring member 23.

The ground probe 4 has a configuration similar to the signal probe 2. Specifically, the ground probe 4 is formed with a conductive material and includes: a first plunger 41 that comes in contact with the ground electrode of the semiconductor integrated circuit 100 when the semiconductor integrated circuit 100 is inspected; a second plunger 42 that comes in contact with the ground electrode of the circuit substrate 200; and a spring member 43 provided between the first plunger 41 and the second plunger 42 to link the first plunger 41 and the second plunger 42 in an extendable/contractible manner. The first plunger 41, the second plunger 42, and the spring member 43 constituting the ground probe 4 share an identical axis.

The spring member 43 has a solid coiling portion 43a on the first plunger 41 side, and a coarse coiling portion 43b on the second plunger 42 side. The end of the solid coiling portion 43a is linked to the first plunger 41. The end of the coarse coiling portion 43b is linked to the second plunger 42. Furthermore, the first plunger 41 and the second plunger 42 are engaged by coil winding force, and/or joined by soldering, with the spring member 43.

The probe holder 3 is formed with a conductive material and includes a first member 31 located on the upper surface side and a second member 32 located on the lower surface side in FIG. 1. The first member 31 and the second member 32 are fixed by an adhesive such as resin, or by screwing.

The first member 31 and the second member 32 have holder holes that form a space housing the signal probe 2 and the ground probe 4. Specifically, the first member 31 has a holder hole 33 that advanceably/retreatably houses the distal end side of the signal probe 2, and a holder hole 34 that passes and holds the distal end side of the ground probe 4. In contrast, the second member 32 has a holder hole 35 that advanceably/retreatably houses the proximal end side of the signal probe 2, and a holder hole 36 that passes and holds the proximal end side of the ground probe 4.

The formation positions of the holder holes 33 to 36 are determined according to the wiring pattern for the inspection signal of the semiconductor integrated circuit 100. Furthermore, the shape of each of the holder holes is determined according to the configuration of the signal probe 2 and the ground probe 4 to be housed.

The holder holes 33 and 35 are formed so that their axes are aligned with each other. The holder holes 33 and 35 each have a hole shape having a uniform diameter in a penetrating direction.

Furthermore, the holder holes 34 and 36 are formed so that their axes are aligned with each other. The holder holes 34 and 36 each have a stepped hole shape having different diameters in the penetrating direction. That is, the holder hole 34 incudes: a small diameter portion 34a having an opening on the end surface of the probe holder 3; and a large diameter portion 34b having a diameter larger than that of the small diameter portion 34a.

The holder hole 36 includes: a small diameter portion 36a having an opening on the end surface of the probe holder 3; and a large diameter portion 36b having a diameter larger than that of the small diameter portion 36a.

Furthermore, an insulating member 37 formed with an insulating material is provided on the inner circumferential surface of the holder hole 33. In contrast, an insulating member 38 formed with an insulating material is provided on the inner circumferential surface of the holder hole 35. The insulating members 37 and 38 each have a stepped hole shape having different diameters in the penetrating direction.

The insulating member 37 includes: a small diameter portion 37a having an opening on the end surface of the probe holder 3; and a large diameter portion 37b having a diameter larger than that of the small diameter portion 37a.

The insulating member 38 includes: a small diameter portion 38a having an opening on the end surface of the probe holder 3; and a large diameter portion 38b having a diameter larger than that of the small diameter portion 38a.

In the first embodiment, the holes (small diameter portions 37a and 38a and large diameter portions 37b and 38b) formed by the insulating members 37 and 38 correspond to first holder holes. The holder holes 34 and 36 correspond to second holder holes.

The first plunger 21 has a function of preventing detachment of the signal probe 2 from the probe holder 3 by bringing the flange into contact with a boundary wall surface between the small diameter portion 37a and the large diameter portion 37b of the insulating member 37. In addition, the second plunger 22 has a function of preventing detachment of the signal probe 2 from the probe holder 3 by bringing the flange into contact with a boundary wall surface between the small diameter portion 38a and the large diameter portion 38b of the insulating member 38.

The first plunger 41 has a function of preventing detachment of the ground probe 4 from the probe holder 3 by bringing the flange into contact with a boundary wall surface between the small diameter portion 34a and the large diameter portion 34b of the holder hole 34. Furthermore, the second plunger 42 has a function of preventing detachment of the ground probe 4 from the probe holder 3 by bringing the flange into contact with a boundary wall surface between the small diameter portion 36a and the large diameter portion 36b of the holder hole 36.

The floating member 5 has a substantially plate shape. The floating member 5 is provided with: a through hole 51 which is arranged according to the electrode and the signal probe 2 of the semiconductor integrated circuit 100 and which penetrates in a direction orthogonal to the plate surface; and a through hole 52 which is arranged according to the electrode and the ground probe 4 of the semiconductor integrated circuit 100 and which penetrates in the direction orthogonal to the plate surface. The through holes 51 and 52 each have a hole shape having a uniform diameter in the penetrating direction. In the first embodiment, the through hole 51 corresponds to a first through hole. Furthermore, the through hole 52 corresponds to a second through hole.

The diameter of the through hole 51 is larger than the diameter of the through hole 52. When the dimensions of the electrodes of the semiconductor integrated circuit 100 are different, it is sufficient as long as the gap between the dimension of the electrode and the through hole 51 is greater than the gap between the dimension of the electrode and the through hole 52. By using the floating member 5, it is possible to easily determine the positions of the electrodes (semiconductor integrated circuit 100) with respect to the contact probes. The diameter here refers to the length in a direction orthogonal to the penetrating direction.

Furthermore, the floating member 5 includes a plurality of connection pins 53 used for the positioning with respect to the probe holder 3; and a spring member 54 that energizes the probe holder 3 and the floating member 5 in a direction away from each other. By passing the connection pins 53 through the holes formed in the probe holder 3 and housing the electrodes of the semiconductor integrated circuit 100 in the through holes 51 and 52 of the floating member 5, it is possible to easily determine the positions of the electrodes with respect to the contact probes.

In the present embodiment, the arrangement position of the floating member 5 and its material are determined so that the characteristic impedance of the signal probe 2 indicates a preset value (for example, 50Ω).

In the present specification, the central axis of the signal probe 2, the central axes of the holder holes 33 and 35 that house the signal probe 2, and the central axis of the through hole 51 of the floating member 5 are aligned with each other. This structure in which the central axes are aligned is referred to as a coaxial structure. In the first embodiment, each of the central axes is aligned with an axis N. The term "aligned" as used herein includes misalignment due to manufacturing errors and inclinations, and includes a state in which the central axes at least partially overlap each other. Incidentally, when the probe holder 3 is formed of resin, only the central axis of the signal probe 2 and the central axis of the through hole 51 of the floating member 5 may be aligned with each other.

The base member 6 is formed with a metal such as aluminum or stainless steel (SUS 304). The base member 6 may be molded from a resin such as engineering plastic such as poly ether sulfone (PES) or polyetheretherketone (PEEK), for example, or an insulating high-strength material such as machinable ceramic, or may be formed by coating on the surface of a metal.

Figure 2:
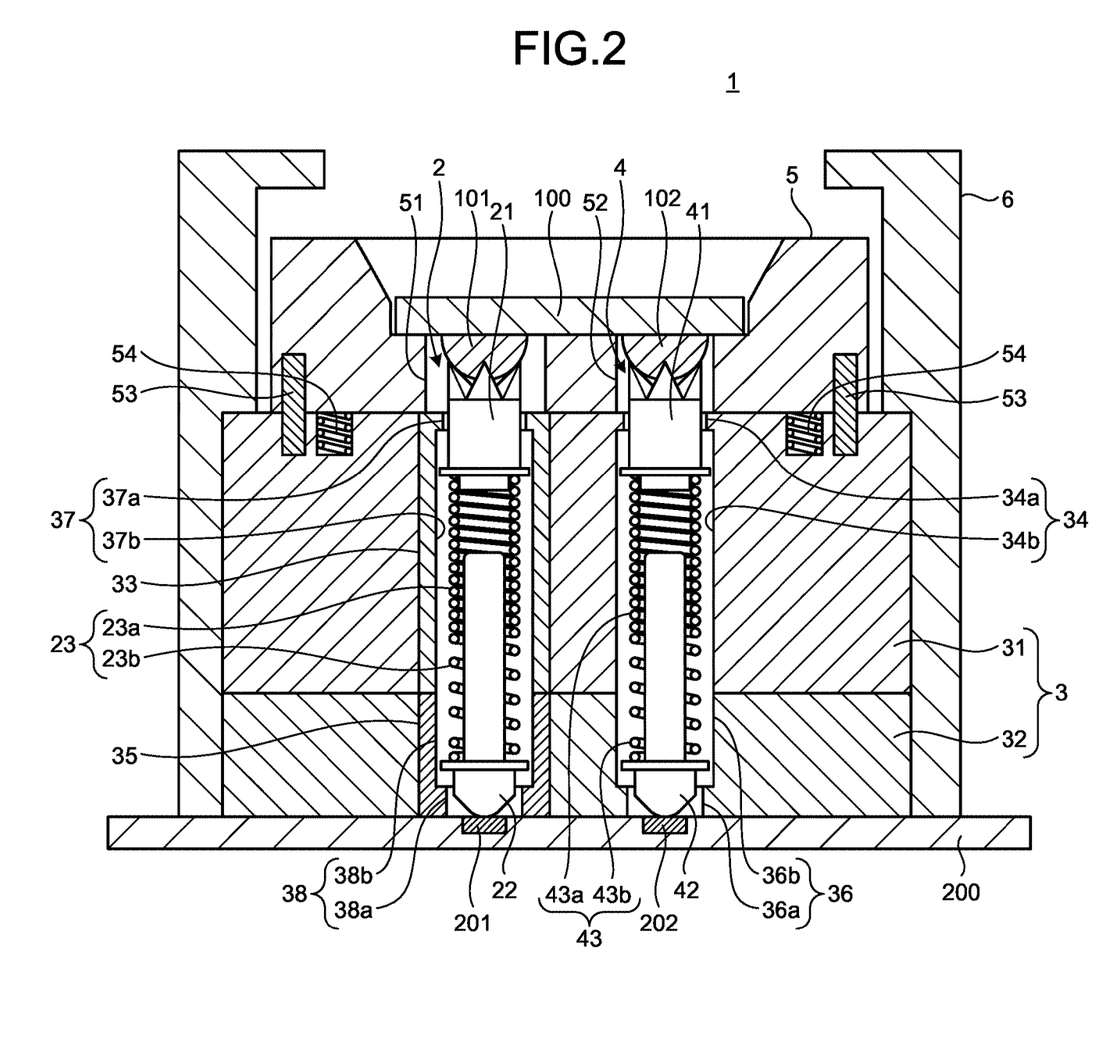
FIG. 2 is a diagram illustrating a state during an inspection of a semiconductor integrated circuit using a probe holder according to the first embodiment of the present invention.

FIG. 2 is a diagram illustrating a state at the time of inspection of the semiconductor integrated circuit 100 in the probe unit 1. In the signal probe 2 during the inspection, the first plunger 21 comes in contact with an electrode 101 for the signal for inspecting the semiconductor integrated circuit 100, and the second plunger 22 comes in contact with an electrode 201 for the signal for inspecting the circuit substrate 200. In the ground probe 4, the first plunger 41 comes in contact with an electrode 102 for grounding the semiconductor integrated circuit 100, and the second plunger 42 comes in contact with an electrode 202 for grounding the circuit substrate 200. During the inspection of the semiconductor integrated circuit 100, the spring members 23 and 43 are in a compressed state in the longitudinal direction due to the contact load from the semiconductor integrated circuit 100. At this time, the solid coiling portion 23a meanders, the second plunger 22 is tilted, and the solid coiling portion 23a and the second plunger 22 come into contact with each other. In the first embodiment, the electrodes 101 and 102 have the same diameter.

The inspection signal supplied from the circuit substrate 200 to the semiconductor integrated circuit 100 during the inspection passes from the electrode 201 of the circuit substrate 200 to reach the electrode 101 of the semiconductor integrated circuit 100 via the second plunger 22, the solid coiling portion 23a, and the first plunger 21 of the signal probe 2. In this manner, in the signal probe 2, the first plunger 21 and the second plunger 22 conduct with each other via the solid coiling portion 23a, making it possible to minimize the conduction path of the electric signal. Accordingly, it is possible to prevent a signal from flowing through the coarse coiling portion 23b during inspection, leading to the reduction in the resistance and inductance. The floating member 5 and the ground probe 4 are electrically connected to each other directly or via the probe holder 3 or the electrode 102, with the floating member 5 also connected to the ground. Furthermore, the floating member 5 and the probe holder 3 may be electrically connected via the connection pin 53 or the spring member 54.

It is known, in general, that, at locations where wires with different characteristic impedances are connected in electronic circuits that handle AC signals, signal reflection occurs by an amount corresponding to the ratio between the different characteristic impedances, leading to hinderance to signal propagation. This similarly applies to the relationship between the semiconductor integrated circuit 100 used and the signal probe 2. That is, when the characteristic impedance of the semiconductor integrated circuit 100 and the characteristic impedance of the signal probe 2 have significantly different values, the loss of the electric signal occurs, leading to distortion of the waveform of the electric signal.

In addition, it is also known that the ratio of signal reflection that occurs at the connection point due to the characteristic impedance difference increases together with an increase in an electrical length of the signal probe 2 (length of the propagation path with respect to the period of the electric signal). That is, in the case of the probe unit 1 according to the first embodiment, the ratio would increase together with an increase in the speed of the semiconductor integrated circuit 100, that is, increase in the frequency. Therefore, when manufacturing the probe unit 1 corresponding to the semiconductor integrated circuit 100 driven at an increased frequency, it is important to perform high-accuracy impedance matching, which achieves matching of the characteristic impedance value of the signal probe 2 with the value of the semiconductor integrated circuit 100.

The first embodiment employs a configuration that adjusts the value of the characteristic impedance at the distal end of the signal probe 2, at a contact between the signal probe 2 and the electrode 101 in particular by arranging the floating member 5 formed of a conductive material around the first plunger 21, rather than altering the structure of the signal probe 2 or the probe holder 3. With such a configuration, it is possible to adjust the characteristic impedance while utilizing the conventional structure of the signal probe 2.

As described above, in the first embodiment, the conductive floating member 5 is arranged around the distal end of the signal probe 2 and connection to the external ground is implemented via the ground probe 4. This uses a coaxial structure in which alignment is achieved among the central axis of the signal probe 2, the central axis of the hole housing the signal probe 2, and the central axis of the through hole 51 of the floating member 5. According to the first embodiment, the coaxial structure is applied by using the conductive floating member 5, making it possible to adjust the characteristic impedance of the end of the contact probe on the side coming in contact with the inspection target.

(First Modification of First Embodiment)

Figure 3:
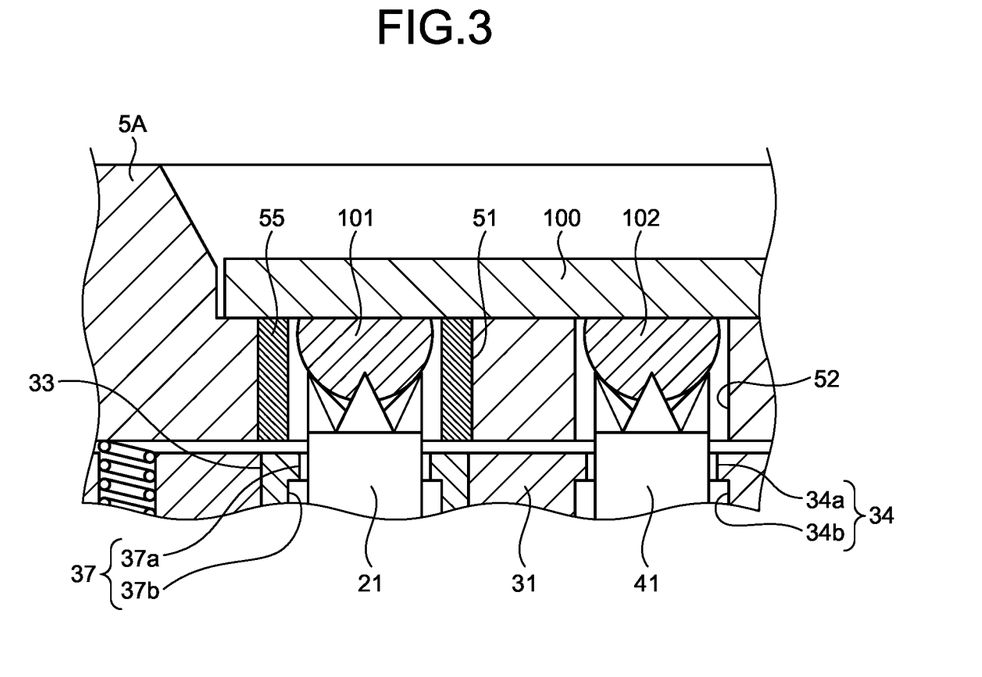
FIG. 3 is a partial cross-sectional view illustrating a configuration of a main part of a probe unit according to a first modification of the first embodiment of the present invention.

FIG. 3 is a partial cross-sectional view illustrating a configuration of a main part of a probe unit according to a first modification of the first embodiment of the present invention. The probe unit according to the first modification includes a floating member 5A instead of the floating member 5 described above. Since the other configurations are similar to those of the probe unit 1, the description thereof will be omitted. The floating member 5A has an insulating member 55 provided on the inner circumferential surface of the through hole 51. The insulating member 55 is formed of an insulating material such as polytetrafluoroethylene (PTFE) and has a tubular shape. The diameter of the outer circumference of the insulating member 55 is the same as the diameter of the through hole 51. Furthermore, the diameter of the inner circumference of the insulating member 55 is larger than the maximum diameter of the electrode 101 and equal to or less than the diameter of the through hole 52. An insulating film may be used instead of the insulating member.

In the first modification, by providing the insulating member 55 in the through hole 51 of the floating member 5A, the electrode 101 of the semiconductor integrated circuit 100 is inserted into the insulating member 55 so as to position the semiconductor integrated circuit 100. According to the first modification, in addition to the effect of the first embodiment described above, it is possible to perform positioning of the electrode 101 by the insulating member 55 as well as positioning of the electrode 102 by the through hole 52.

Regarding the through hole 51 to have the insulating member 55 in the first modification, it is allowable to use all through holes formed in the floating member 5A, or only a part of the through holes.

(Second Modification of First Embodiment)

Figure 4:
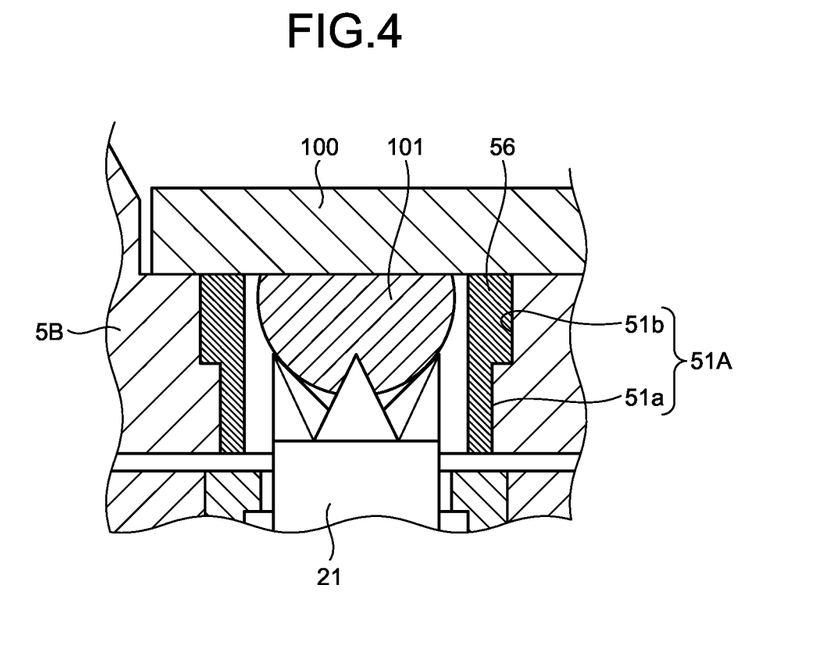
FIG. 4 is a partial cross-sectional view illustrating a configuration of a main part of a probe unit according to a second modification of the first embodiment of the present invention.

FIG. 4 is a partial cross-sectional view illustrating a configuration of a main part of a probe unit according to a second modification of the first embodiment of the present invention. The probe unit according to the second modification includes a floating member 5B instead of the floating member 5 described above. Since the other configurations are similar to those of the probe unit 1, the description thereof will be omitted. The floating member 5B has a through hole 51A formed instead of the above-described through hole 51. The other configurations are similar to the floating member 5.

The through hole 51A has a stepped hole shape having different diameters in the penetrating direction. That is, the through hole 51A has a small diameter portion 51a having an opening on the end surface on the side where the signal probe 2 is inserted; and a large diameter portion 51b having an opening on the end surface on the side where the electrode 101 of the semiconductor integrated circuit 100 is inserted and having a diameter larger than the small diameter portion 51a.

An insulating member 56 is provided on the inner circumferential surface of the through hole 51A. The insulating member 56 is formed of an insulating material such as polytetrafluoroethylene (PTFE) and has a tubular shape. The diameter of the outer circumference of the insulating member 56 is partially different, similar to the diameter of the through hole 51A. Furthermore, the diameter of the inner circumference of the insulating member 56 is larger than the maximum diameter of the electrode 101 and equal to or less than the diameter of the through hole 52. An insulating film may be used instead of the insulating member. Furthermore, the diameter of the inner circumference of the insulating member 56 may be partially varied according to the diameter of the outer circumference.

In this second modification, the through hole 51A of the floating member 5B is formed into a stepped shape with the insulating member 56, making it possible to adjust the characteristic impedance according to the diameter of the distal end of the first plunger 21 and the shape of the electrode 101 of the semiconductor integrated circuit 100. According to the second modification, in addition to the effect of the first embodiment described above, it is possible to adjust the characteristic impedance at the contact between the first plunger 21 and the electrode 101 with higher accuracy.

(Third Modification of First Embodiment)

Figure 5:
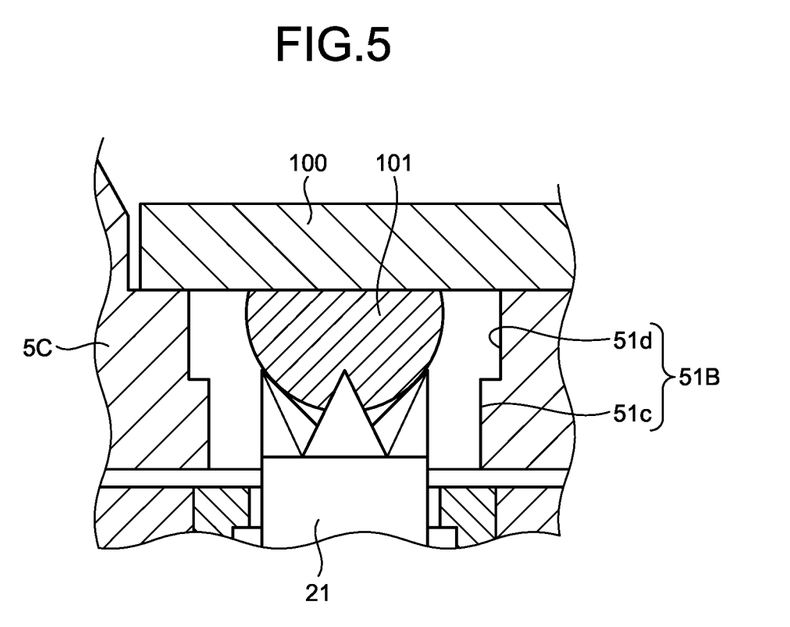
FIG. 5 is a partial cross-sectional view illustrating a configuration of a main part of a probe unit according to a third modification of the first embodiment of the present invention.

FIG. 5 is a partial cross-sectional view illustrating a configuration of a main part of a probe unit according to a third modification of the first embodiment of the present invention. The probe unit according to the third modification includes a floating member 5C instead of the floating member 5 described above. Since the other configurations are similar to those of the probe unit 1, the description thereof will be omitted. The floating member 5C has a through hole 51B formed instead of the above-described through hole 51. The other configurations are similar to the floating member 5.

The through hole 51B has a stepped hole shape having different diameters in the penetrating direction. That is, the through hole 51B has a small diameter portion 51c having an opening on the end surface on the side where the signal probe 2 is inserted; and a large diameter portion 51d having an opening on the end surface on the side where the electrode 101 of the semiconductor integrated circuit 100 is inserted and having a diameter larger than the small diameter portion 51c. In the through hole 51B, the diameter of the large diameter portion 51d is the maximum diameter. The diameter of the large diameter portion 51d may be equal to or larger than the diameter of the through hole 52, or may be smaller than the diameter of the through hole 52. The diameter of the large diameter portion 51d can be appropriately changed according to the electrode for positioning with respect to the floating member 5C. Although the large diameter portion is illustrated in a straight line, the diameter may be changed according to the shape of the electrode.

In the third modification, the through hole 51B of the floating member 5C is formed to have a stepped shape, making it possible to adjust the characteristic impedance according to the diameter of the distal end of the first plunger 21 and the maximum diameter of the electrode 101 of the semiconductor integrated circuit 100. According to the third modification, in addition to the effect of the first embodiment described above, it is possible to adjust the characteristic impedance at the contact between the first plunger 21 and the electrode 101 with higher accuracy.

Second Embodiment

Figure 6:
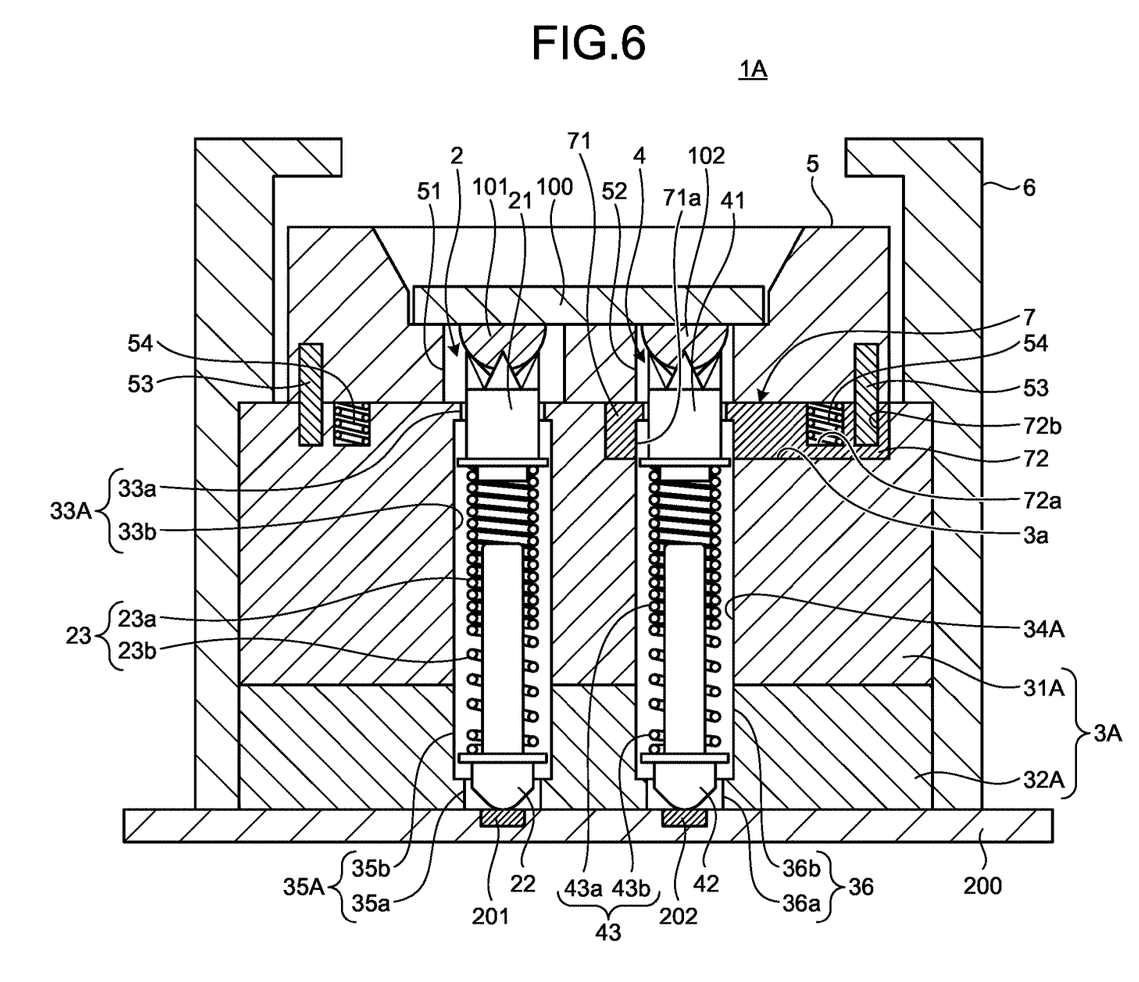
FIG. 6 is a partial cross-sectional view illustrating a configuration of a main part of a probe unit according to a second embodiment of the present invention.

FIG. 6 is a partial cross-sectional view illustrating a configuration of a main part of a probe unit according to a second embodiment of the present invention, illustrating a state at the time of inspection of the semiconductor integrated circuit 100 in a probe unit 1A. The probe unit 1A according to the second embodiment includes a probe holder 3A instead of the probe holder 3 of the probe unit 1 described above. Since the other configurations are similar to those of the probe unit 1, the description thereof will be omitted.

The probe holder 3A is formed with an insulating material and includes a first member 31A located on the upper surface side and a second member 32A located on the lower surface side in FIG. 6. The first member 31A and the second member 32A are fixed by an adhesive such as resin, or by screwing. Furthermore, the first member 31A is provided with a conductive member 7 that passes and holds the distal end side of the ground probe 4. In the second embodiment, the first member 31A and the second member 32A form a main body.

The first member 31A and the second member 32A have holder holes forming a space housing the signal probe 2, the ground probe 4, and the conductive member 7. Specifically, the first member 31A has a holder hole 33A that passes and holds the distal end side of the signal probe 2, a hole 3a housing the conductive member 7, and a holder hole 34A that passes the ground probe 4. In contrast, the second member 32A has a holder hole 35A that advanceably/retreatably houses the proximal end side of the signal probe 2, and a holder hole 36 that passes and holds the proximal end side of the ground probe 4.

The holder holes 33A and 35A are formed so that their axes are aligned with each other.

The holder holes 34A and 36 are formed so that their axes are aligned with each other.

The holder hole 34A has a hole shape having a uniform diameter in the penetrating direction.

Furthermore, the holder holes 33A, 35A and 36 each have a stepped hole shape having different diameters in the penetrating direction. That is, the holder hole 33A incudes: a small diameter portion 33a having an opening on the end surface of the probe holder 3; and a large diameter portion 33b having a diameter larger than that of the small diameter portion 33a.

The holder hole 35A includes: a small diameter portion 35a having an opening on the end surface of the probe holder 3; and a large diameter portion 35b having a diameter larger than that of the small diameter portion 35a.

Figure 7:
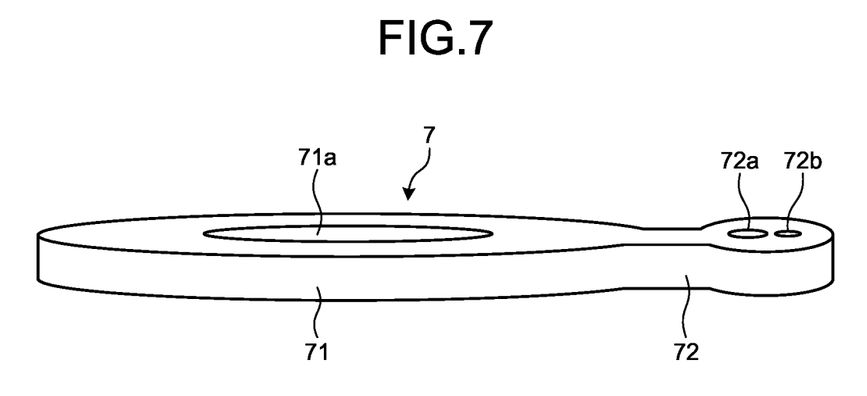
FIG. 7 is a perspective view illustrating a configuration of a main part of the probe unit according to the second embodiment of the present invention.

FIG. 7 is a perspective view illustrating a configuration of a main part (conductive member 7) of the probe unit according to the second embodiment of the present invention. The conductive member 7 is formed of a conductive material and forms a part of the upper surface of the probe holder 3A. The conductive member 7 has a disc portion 71 which is conductive and having a hollow disc shape, and an extending portion 72 which is conductive and extending from a part of a side surface of the disc portion 71.

The disc portion 71 has a first hole 71a that can pass the first plunger 41. The first hole 71a forms a hollow space having a stepped shape, and the flange of the first plunger 41 comes into contact with the stepped portion.

The extending portion 72 has second holes each configured to house the connection pin 53 and the spring member 54. Specifically, the second holes include a first housing 72a that houses the connection pin 53 and a second housing 72b that houses the spring member 54. For example, a part of the inner wall of the first hole 71a and a part of the first plunger 41 come into contact with each other during inspection, electrically connecting the conductive member 7 and the ground probe 4 with each other. Furthermore, the floating member 5 and the conductive member 7 may be electrically connected with each other via the connection pin 53 or the spring member 54.

In the second embodiment, the holder holes 33A and 35A correspond to the first holder holes. Furthermore, the holder holes 34A and 36 and the hole formed by the first hole 71a correspond to the second holder holes. The holder holes 34A and 36 correspond to partial holder holes.

In the second embodiment, the first member 31A and the second member 32A have an insulating property, with the ground probe 4 and the floating member 5 connected via the conductive member 7. According to the second embodiment, in addition to the effect of the first embodiment described above, it is possible to ensure the electrical connection between the conductive member 7 and the ground probe 4.

In the second embodiment, the first hole 71a has been described as having a stepped shape. Alternatively, however, the diameter of the first hole 71a may be reduced to the size smaller than the diameter of the holder hole 34A so as to form the stepped portion by using the first hole 71a and the holder hole 34A, or the holder hole 34A may have a stepped portion.

Furthermore, in the second embodiment, a conductive film may be used instead of the conductive member 7. This film is, for example, a film having a thickness of several microns or plating.

Third Embodiment

Figure 8:
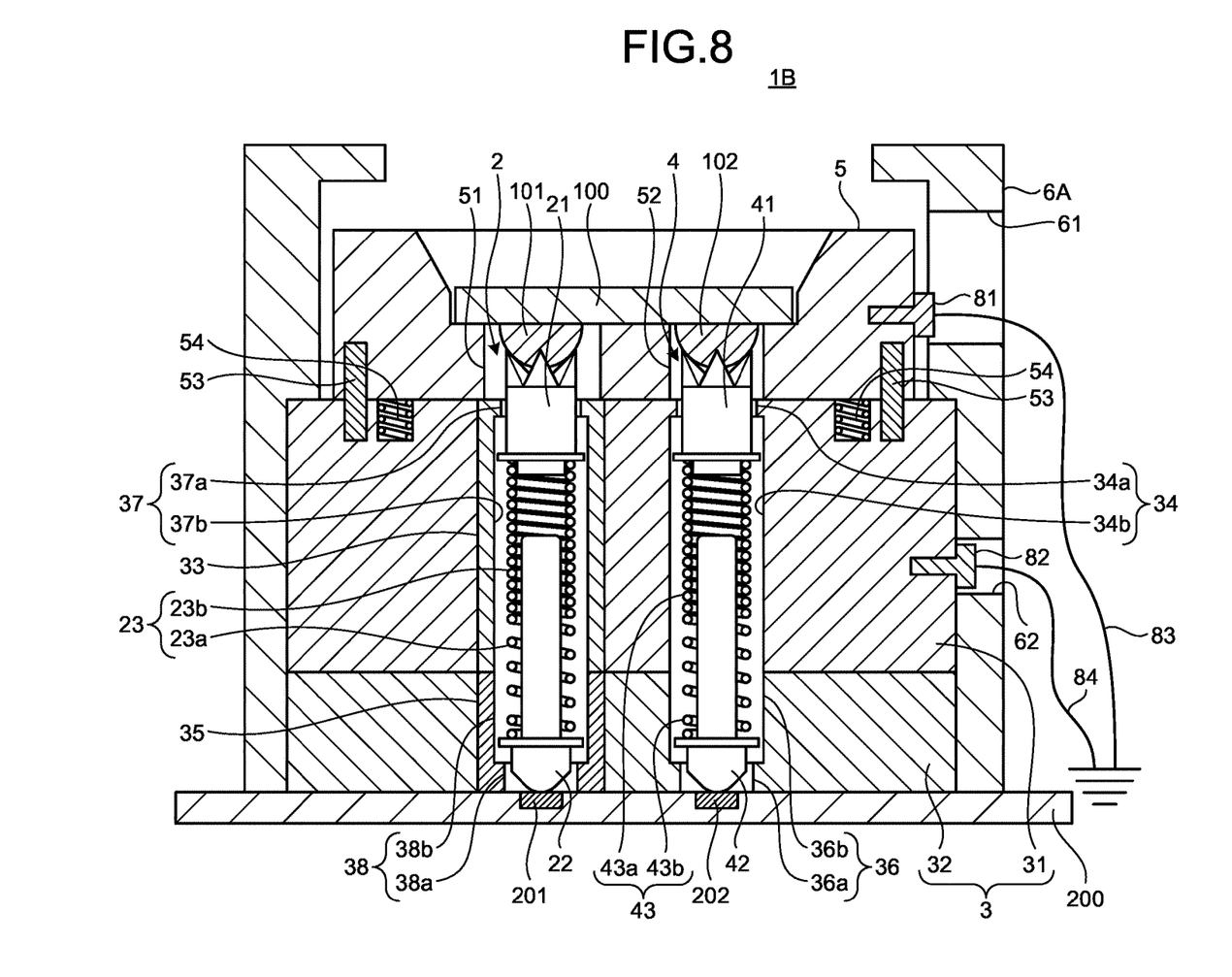
FIG. 8 is a partial cross-sectional view illustrating a configuration of a main part of a probe unit according to a third embodiment of the present invention.

FIG. 8 is a partial cross-sectional view illustrating a configuration of a main part of a probe unit according to a third embodiment of the present invention, illustrating a state at the time of inspection of the semiconductor integrated circuit 100 in a probe unit 1B. The probe unit 1B according to the third embodiment includes a base member 6A instead of the base member 6 of the probe unit 1 described above. Since the other configurations are similar to those of the probe unit 1, the description thereof will be omitted. In the third embodiment, the floating member 5 is equipped with a conductive pin 81 for ground potential connection while the probe holder 3 is equipped with a conductive pin 82 for ground potential connection. The conductive pins 81 and 82 are formed with conductive screws, for example.

The base member 6A has through holes 61 and 62 which respectively pass ground wires 83 and 84 connected to the external ground potential.

Here, the ground wire 83 is connected to the conductive pin 81. The ground wire 84 is connected to the conductive pin 82.

In the third embodiment, the probe holder 3 and the floating member 5 are directly connected to the ground potential. According to the third embodiment, in addition to the effect of the first embodiment described above, it is possible to achieve more accurate inspection by connecting the floating member 5 directly to the ground potential.

The configuration of the contact probe described here is merely an example, and various types of conventionally known probes can be applied. For example, not limited to the configuration with the plunger and the coil spring as described above, it is also allowable to apply various configurations such as a probe having a pipe member, a spring pin, a solid conductive member, a conductive pipe, or a wire probe that obtains the load by bending the wire in an arch shape, or a connection terminal (connector) connecting electrical contacts to each other, or a combination of these probes as appropriate.

INDUSTRIAL APPLICABILITY

As described above, the probe unit according to the present invention is suitable for adjusting the characteristic impedance of the end of the contact probe on the side coming in contact with the inspection target.

REFERENCE SIGNS LIST 1, 1A, 1B PROBE UNIT
2 CONTACT PROBE (SIGNAL PROBE)
3, 3A PROBE HOLDER
4 CONTACT PROBE (GROUND PROBE)
5, 5A, 5B, 5C FLOATING MEMBER
6, 6A BASE MEMBER
7 CONDUCTIVE MEMBER
21, 41 FIRST PLUNGER
22, 42 SECOND PLUNGER
23, 43, 54 SPRING MEMBER
23a, 43a SOLID COILING PORTION
23b, 43b COARSE COILING PORTION
51, 52 THROUGH HOLE
53 CONNECTION PIN
71 DISC PORTION
71a FIRST HOLE
72 EXTENDING PORTION
72a FIRST HOUSING
72b SECOND HOUSING
100 SEMICONDUCTOR INTEGRATED CIRCUIT
101, 102, 201, 202 ELECTRODE
200 CIRCUIT SUBSTRATE

The invention claimed is:

1. A probe unit comprising:
a first contact probe configured to come in contact with a signal electrode provided on a contact target on one end side in a longitudinal direction;
a second contact probe configured to come in contact with a ground electrode provided on the contact target on one end side in a longitudinal direction;
a probe holder including:
a first holder hole through which the first contact probe passes, and
a second holder hole through which the second contact probe passes; and
a conductive floating member including:
a first through hole to which the one end of the first contact probe is inserted from one end side and the signal electrode is inserted from another end side, and
a second through hole to which the one end of the second contact probe is inserted from one end side and the ground electrode is inserted from another end side, a size of an opening of the second through hole being different from a size of an opening of the first through hole,
wherein the probe holder is configured such that at least an inner circumferential surface of the first holder hole has an insulating property,
the probe unit has a coaxial structure in which a central axis of the first contact probe and a central axis of the first through hole of the floating member are aligned with each other, and wherein the conductive floating member is electrically connected to the second contact probe directly or indirectly.

2. The probe unit according to claim 1, wherein a maximum diameter of the first through hole is larger than a maximum diameter of the second through hole.

3. The probe unit according to claim 2, wherein
a tubular insulating member is provided on an inner circumferential surface of the first through hole, and
a diameter of an inner circumferential surface of the insulating member is equal to or less than a diameter of the second through hole.

4. The probe unit according to claim 1, wherein the first through hole has a stepped shape having a diameter corresponding to the one end of the first contact probe and the signal electrode.

5. The probe unit according to claim 1, wherein
the floating member includes a connection pin configured to position the floating member with respect to the probe holder, and
the probe holder includes:
  an insulating main body including
    the first holder hole, and
    a partial holder hole forming a part of the second holder hole; and
  a conductive member having conductivity, the conductive member including
    a first hole that constitutes a part of the second holder hole, the second contact probe passing through the first hole, and
    a second hole configured to house a part of the connection pin.

* * * * *